(12) United States Patent
Warren et al.

(10) Patent No.: US 7,635,606 B2
(45) Date of Patent: Dec. 22, 2009

(54) WAFER LEVEL PACKAGE WITH CAVITIES FOR ACTIVE DEVICES

(75) Inventors: Robert W. Warren, Newport Beach, CA (US); Gene Gan, Fremont, CA (US); Tony LoBianco, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 92 days.

(21) Appl. No.: 11/800,379

(22) Filed: May 5, 2007

(65) Prior Publication Data

US 2009/0075431 A1 Mar. 19, 2009

Related U.S. Application Data

(60) Provisional application No. 60/835,302, filed on Aug. 2, 2006.

(51) Int. Cl.
*H01L 21/00* (2006.01)

(52) U.S. Cl. .................. 438/64; 257/E23.022

(58) Field of Classification Search .................. 257/688, 257/704; 438/28, 51–53, 55, 64
See application file for complete search history.

(56) References Cited

U.S. PATENT DOCUMENTS

| | | | |
|---|---|---|---|
| 5,323,051 A | 6/1994 | Adams et al. | |
| 5,448,014 A | 9/1995 | Kong et al. | |
| 5,757,072 A | 5/1998 | Gorowitz et al. | |
| 6,057,597 A * | 5/2000 | Farnworth et al. | .......... 257/710 |
| 6,214,644 B1 | 4/2001 | Glenn | |
| 6,297,072 B1 | 10/2001 | Tilmans et al. | |
| 6,297,551 B1 | 10/2001 | Dudderar et al. | |

(Continued)

FOREIGN PATENT DOCUMENTS

JP 2003218256 A 7/2003

(Continued)

OTHER PUBLICATIONS

K. C. Eun et al., "Fully Embedded LTCC Spiral Inductors Incorporating Air Cavity for High Q-factor and SRF," IEEE Electronic Components and Technology Conference, vol. 1, Jun. 1-4, 2004, pp. 1101-1103.

(Continued)

*Primary Examiner*—David A Zameke
*Assistant Examiner*—Jenny L Wagner
(74) *Attorney, Agent, or Firm*—Lando & Anastasi, LLP

(57) ABSTRACT

According to one exemplary embodiment, a method for forming a wafer level package includes fabricating an active device on a substrate in a semiconductor wafer, forming polymer walls around the active device, and applying a blanket film over the semiconductor wafer and the polymer walls to house the active device in a substantially enclosed cavity formed by the polymer walls and the blanket film. By way of examples and without limitation, the active device can be a microelectromechanical systems ("MEMS") device, a bulk acoustic wave ("BAW") filter, or a surface acoustic wave ("SAW") filter. According to one embodiment, solder bumps can be applied to interconnect traces of the active device, and the semiconductor wafer can then be diced to form an individual die. According to another embodiment, the semiconductor wafer can be diced to form an individual die, then the individual die is wire bonded to a circuit board.

16 Claims, 4 Drawing Sheets

U.S. PATENT DOCUMENTS

| | | | |
|---|---|---|---|
| 6,358,773 B1 | 3/2002 | Lin et al. | |
| 6,376,280 B1 | 4/2002 | Ruby et al. | |
| 6,380,616 B1 * | 4/2002 | Tutsch et al. | 257/686 |
| 6,399,426 B1 | 6/2002 | Capote et al. | |
| 6,402,970 B1 | 6/2002 | Lin | |
| 6,498,114 B1 | 12/2002 | Amundson | |
| 6,530,515 B1 | 3/2003 | Glenn et al. | |
| 6,566,745 B1 | 5/2003 | Beyne et al. | |
| 6,630,725 B1 | 10/2003 | Kuo et al. | |
| 6,660,564 B2 | 12/2003 | Brady | |
| 6,743,656 B2 | 6/2004 | Orcutt et al. | |
| 6,743,991 B1 | 6/2004 | Wong et al. | |
| 6,767,764 B2 | 7/2004 | Saia et al. | |
| 6,777,263 B1 | 8/2004 | Gan et al. | |
| 6,787,897 B2 | 9/2004 | Geefay et al. | |
| 6,794,739 B2 | 9/2004 | Kobayashi et al. | |
| 6,800,508 B2 * | 10/2004 | Kimura | 438/123 |
| 6,838,309 B1 | 1/2005 | McCann | |
| 6,846,725 B2 | 1/2005 | Nagarajan et al. | |
| 6,858,929 B2 | 2/2005 | Zuo et al. | |
| 6,953,999 B2 | 10/2005 | Strandberg et al. | |
| 7,045,459 B2 | 5/2006 | Freidhoff | |
| 7,045,868 B2 | 5/2006 | Ding et al. | |
| 7,059,048 B2 | 6/2006 | Konig et al. | |
| 7,198,725 B2 | 4/2007 | Shen | |
| 7,202,560 B2 | 4/2007 | Dungan et al. | |
| 7,203,388 B2 | 4/2007 | Ha et al. | |
| 7,203,394 B2 | 4/2007 | Wiegele et al. | |
| 7,268,436 B2 | 9/2007 | Aigner et al. | |
| 7,275,424 B2 | 10/2007 | Felton et al. | |
| 7,311,242 B2 | 12/2007 | Six | |
| 7,319,598 B2 | 1/2008 | Steiner et al. | |
| 7,335,972 B2 | 2/2008 | Chanchani | |
| 7,368,808 B2 | 5/2008 | Heck et al. | |
| 7,456,497 B2 | 11/2008 | Higashi | |
| 2002/0132463 A1 | 9/2002 | Urushima | |
| 2004/0063249 A1 | 4/2004 | Lin et al. | |
| 2004/0072071 A1 | 4/2004 | Watanabe et al. | |
| 2004/0178492 A1 | 9/2004 | Tsukamoto et al. | |
| 2004/0259325 A1 | 12/2004 | Gan | |
| 2005/0054133 A1 | 3/2005 | Felton et al. | |
| 2006/0134829 A1 | 6/2006 | Rosa | |
| 2006/0211233 A1 | 9/2006 | Gan et al. | |
| 2006/0220173 A1 | 10/2006 | Gan et al. | |
| 2007/0274058 A1 | 11/2007 | Cousin | |
| 2008/0003761 A1 | 1/2008 | Gan et al. | |
| 2008/0064142 A1 | 3/2008 | Gan et al. | |
| 2008/0217708 A1 | 9/2008 | Reisner et al. | |

FOREIGN PATENT DOCUMENTS

| | | |
|---|---|---|
| KR | 2003-0088996 | 11/2003 |
| TW | 457657 | 10/2001 |
| WO | 01/19142 | 3/2001 |

OTHER PUBLICATIONS

M. Franosch, "Wafer-Level-Package for Bulk Acoustic Wave (BAW) Filters," IEEE Microwaves Symposium, vol. 2, Jun. 6-11, 2004, pp. 493-496.

Young Chul Lee et al., "Monolithic LTCC SiP Transmitter for 60GHz Wireless Communication Terminals," IEEE Microwaves Symposium, Jun. 17, 2005, pp. 1015-1018.

* cited by examiner

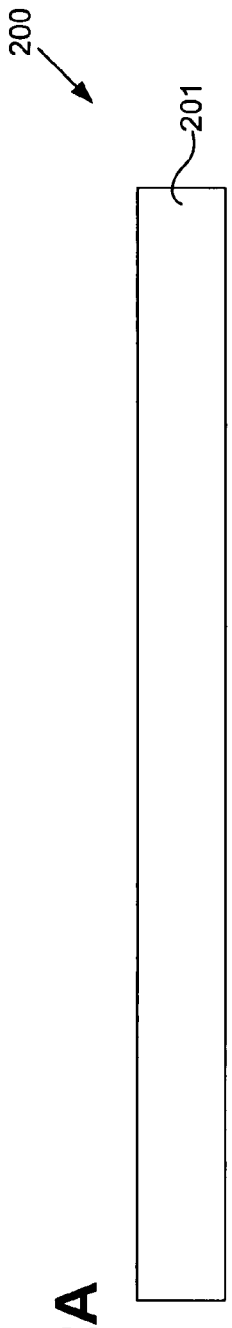
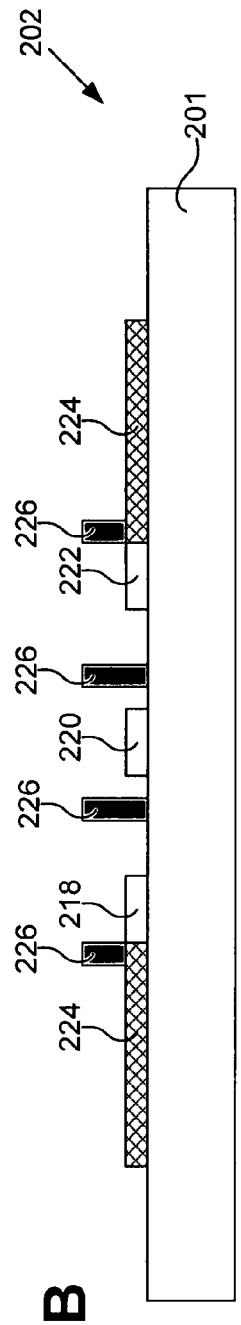
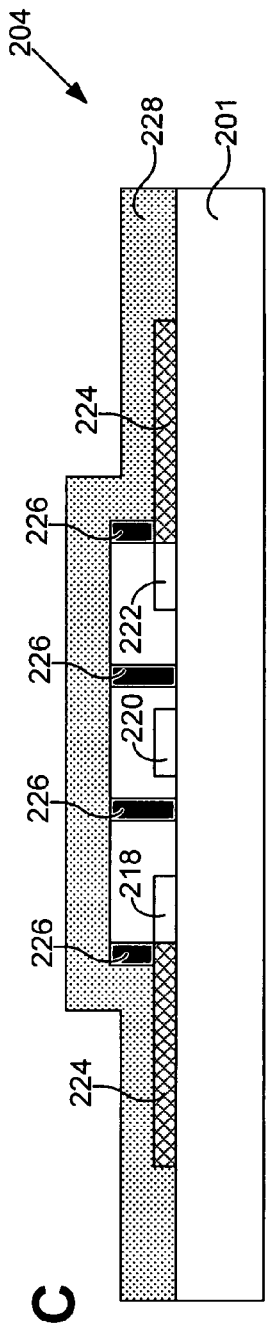
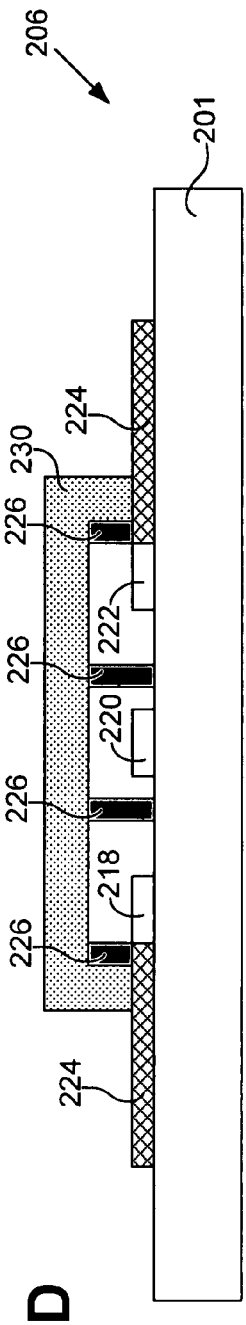

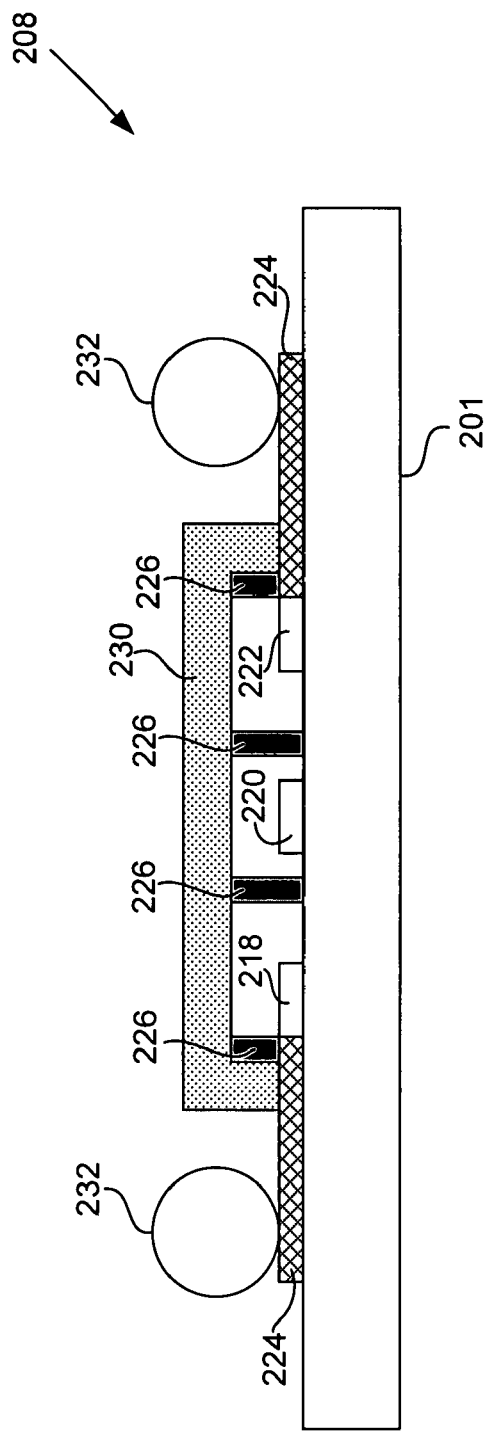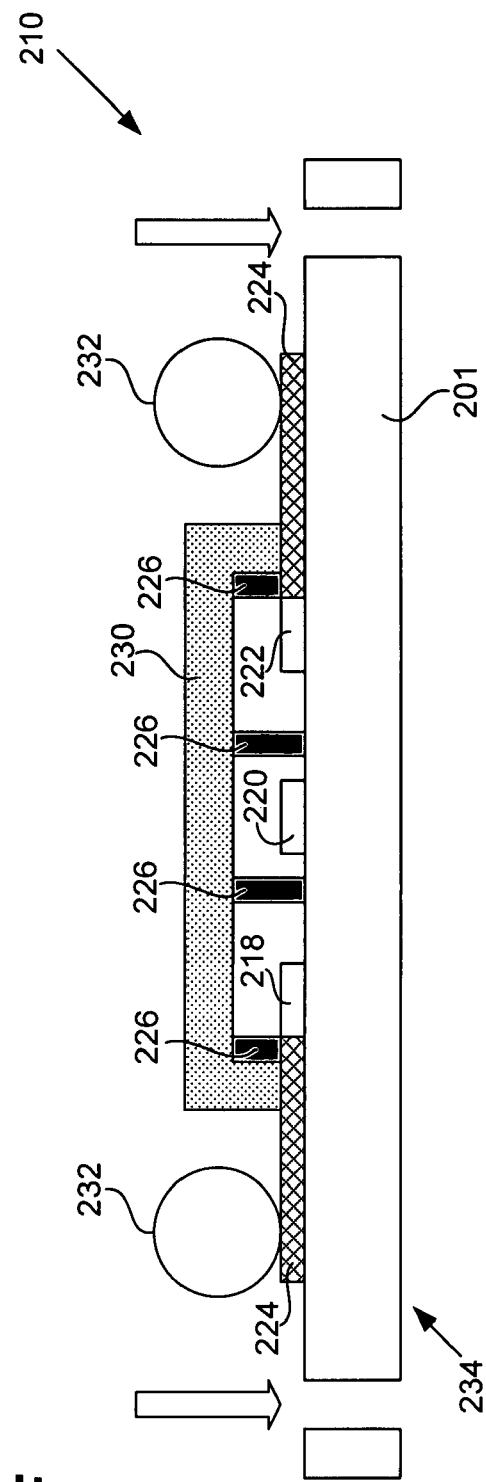

WAFER LEVEL PACKAGE WITH CAVITIES FOR ACTIVE DEVICES

The present application claims the benefit of and priority to a pending provisional patent application entitled "Polymer Based Wafer Level Package With Cavities," Ser. No. 60/835, 302 filed on Aug. 2, 2006. The disclosure in that pending provisional application is hereby incorporated fully by reference into the present application.

BACKGROUND OF THE INVENTION

1. Field of the Invention

The present invention relates to the field of semiconductor packaging. More specifically, the invention relates to fabrication of wafer level packages for electronic devices.

2. Background Art

Wafer level packaging permits a semiconductor die and package to be manufactured and tested prior to wafer singulation. Many electronic devices, such as microelectromechanical systems ("MEMS") devices, bulk acoustic wave ("BAW") filters, surface acoustic wave ("SAW") filters, and many RF devices, require a wafer level package with a cavity around the device to achieve the best performance. However, conventional wafer packaging techniques are costly and, in some applications, the wafer level package can amount to approximately 40% to 90% of the total device cost.

Prior solutions have required numerous, difficult, and costly process steps to achieve a wafer level package with a cavity. The conventional method typically involves spin coating and photo patterning a sacrificial layer over a semiconductor wafer to cover the active device area. Next, a polymer layer is spin coated over the whole wafer, which is photo-patterned to form the permanent package structure and release holes. Then the sacrificial layer is etched out or removed through the release holes to create cavities around the active devices. If the release holes are too small, completely removing the sacrificial layer without leaving any residue on the active device can be challenging and time consuming, and can result in yield loss. If the release holes are too big, the polymer layer can cave in over the active device. Finally, an additional polymer layer must be formed to seal the release holes to complete the cavity around the active device.

In another conventional method, individual "lids" are designed and placed over each active device on the semiconductor wafer. Since each active device must be individually sealed, this "pick and place" serial process can be very time consuming and costly to implement. Thus it can be seen that there is a need in the art for an efficient and inexpensive wafer level package accommodating cavities without the shortcomings of the conventional wafer level packages.

SUMMARY OF THE INVENTION

A wafer level package with cavities for active devices, substantially as shown in and/or described in connection with at least one of the figures, and as set forth more completely in the claims.

BRIEF DESCRIPTION OF THE DRAWINGS

FIGS. 2A through 2D illustrate cross-sectional views, which include portions of a semiconductor wafer processed according to an embodiment of the invention, corresponding to certain steps of FIG. 1.

FIGS. 2E through 2F illustrate cross-sectional views, which include portions of a semiconductor wafer processed according to an embodiment of the invention, corresponding to certain steps of FIG. 1.

DETAILED DESCRIPTION OF THE INVENTION

The present invention is directed to a wafer level package with cavities for active devices. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
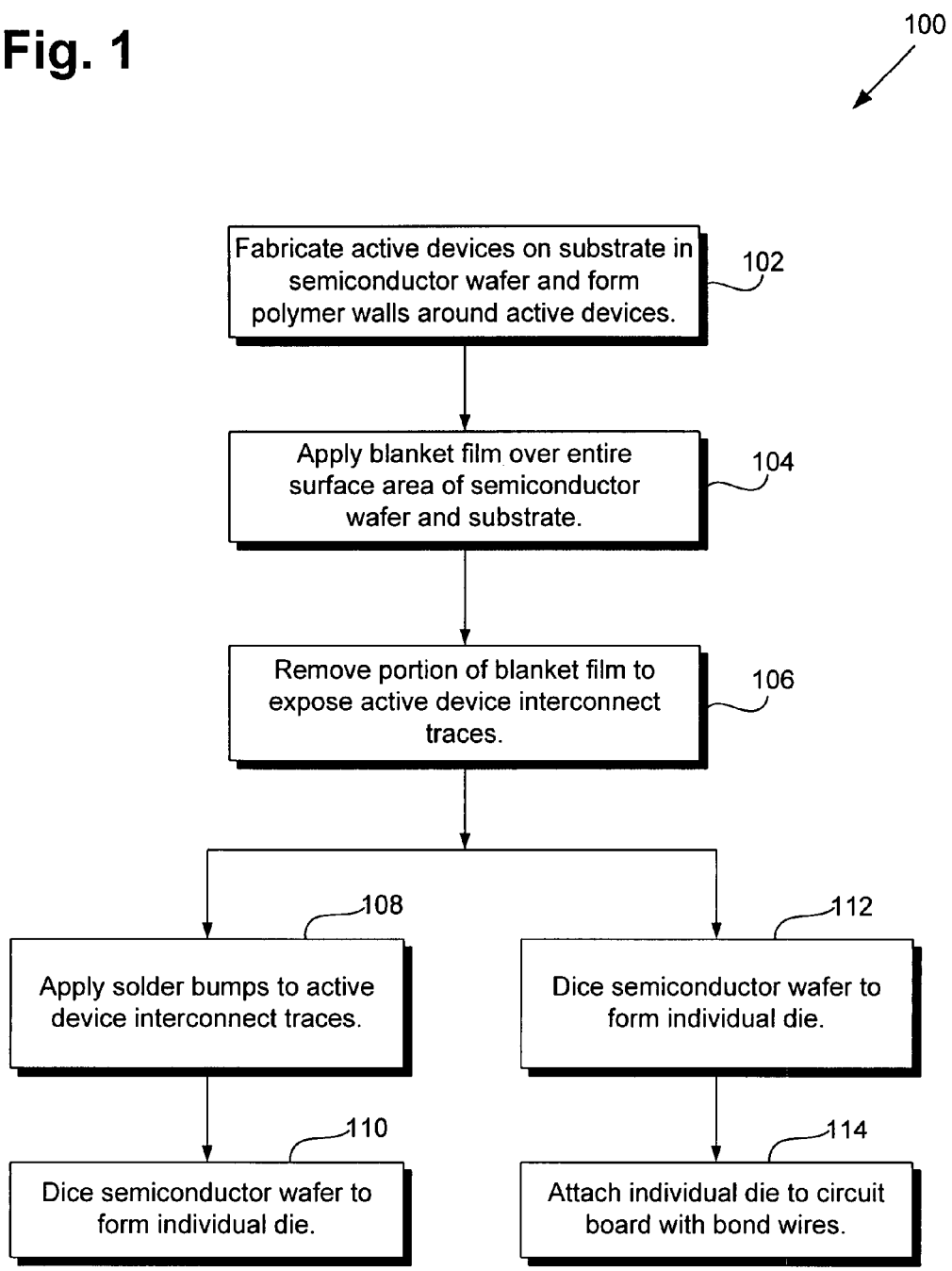
FIG. 1 shows a flowchart illustrating steps taken to implement an embodiment of the present invention.

FIG. 1 shows flowchart 100, which includes the steps taken to implement two embodiments of the present invention, starting with structure 200 of FIG. 2A. Certain details and features have been left out of flowchart 100 that are apparent to a person of ordinary skill in the art. For example, a step may consist of one or more substeps or may involve specialized equipment or materials, as known in the art.

Steps 102 through 114 indicated in flowchart 100 are sufficient to describe two embodiments of the present invention, other embodiments of the invention may utilize steps different from those shown in flowchart 100. It is noted that the processing steps shown in flowchart 100 are performed on a portion of a semiconductor wafer, such as structure 200 in FIG. 2A that includes substrate 201. Substrate 201 can comprise silicon, silicon-germanium, lithium tantalite, gallium arsenide, or other appropriate materials, for example.

Moreover, structures 202, 204, 206, 208, 210, 212, and 214 in FIGS. 2B, 2C, 2D, 2E, 2F, 2G, and 2H illustrate the result of performing, on structure 200, steps 102, 104, 106, 108, 110, 112, and 114 of flowchart 100 of FIG. 1, respectively. For example, structure 202 shows structure 200 after processing step 102, structure 204 shows structure 202 after processing step 104, structure 206 shows structure 204 after processing step 106, and so forth.

Continuing with step 102 in FIG. 1 and structure 202 in FIG. 2B, step 102 of flowchart 100 comprises fabricating active devices 218, 220, and 222 on substrate 201 and forming polymer walls 226 around active devices 218, 220, and 222. Active devices 218, 220, and 222 can be microelectromechanical systems ("MEMS") devices, bulk acoustic wave ("BAW") filters, surface acoustic wave ("SAW") filters, and/or other appropriate active electronic devices, and can be fabricated on substrate 201 as known in the art. Also shown in FIG. 2B are interconnect ("I/C") traces 224. I/C traces 224, or Input/Output pads, are the inputs and outputs for the signals received and sent by active devices 218, 220, and 222. In one embodiment, I/C traces 224 can be over the substrate passivation. In another embodiment, I/C traces 224 are underneath the substrate passivation.

Polymer walls 226 are formed around active devices 218, 220, and 222 on substrate 201. One purpose of polymer walls 226 is to support a ceiling or blanket film that would be able to withstand a molding pressure of approximately 800 psi, for example. As shown in the embodiment of FIG. 2B, polymer walls 226 form a perimeter around active devices 218, 220, and 222, and are also situated between active devices 218 and 220 as well as between active devices 220 and 222. Additionally, polymer walls 226 can be situated over I/C traces 224, for example. In one embodiment, polymer walls can be formed only around the perimeter of active devices 218, 220, and 222 to provide support for a single large cavity over all active devices. In other embodiments, structure 202 may only include a single active device, or may include many additional active devices. In one embodiment, passive devices could also be housed inside the cavity. Polymer walls 226 can have a height of approximately 20 microns to 100 microns, and a width of approximately 30 microns to 100 microns, for example. In other embodiments, polymer walls 226 can have different heights and widths depending on the size and number of active devices to be enclosed and the level of support required of polymer walls 226.

Polymer walls 226 can be formed by applying a spin-on polymer or a dry film polymer, and then photo-defining or laser etching the desired number and arrangement of polymer walls around active devices 218, 220, and 222, for example. Polymer walls 226 can be formed in other appropriate manners, but the preferred and lower cost approach would be for polymer walls 226 to be photosensitive. In one embodiment, polymer walls 226 can comprise SU8, an epoxy material from MicroChem Inc.®, for example. SU8 is an example of a viscous polymer that can be spun or spread over a thickness of 2.0 millimeters or more and still be processed with standard masking steps. It can be used to pattern high (for example, greater than 20) aspect ratio structures. In other embodiments, polymer walls 226 can comprise a dry cell, an epoxy, a dry film photoresist, or a polymer, for example.

Referring to step 104 in FIG. 1 and structure 204 in FIG. 2C, at step 104 of flowchart 100, a blanket film 228 is applied over the entire surface area of the semiconductor wafer and substrate 201, and can be SU8, DuPont® WPR® (wafer photo resist), or another appropriate material, for example. SU8 is a liquid that can be spun on and cured to form a uniform blanket film 228 over the semiconductor wafer and substrate 201. In another embodiment, DuPont® WPR® is applied to the semiconductor wafer and substrate 201 as a film and then put into an autoclave where pressure and heat bond the film to the surface of structure 204, for example. The type of blanket film used can vary depending on the application. For example, it would be advantageous to use a thin blanket film for structures requiring thin or intricate polymer wall 226 designs, but would be advantageous to use a thick blanket film, such as SU8, for structures using simple polymer wall 226 designs. As shown in FIG. 2C, blanket film 228 completely covers the semiconductor wafer and substrate 201, including active devices 218, 220, and 222, I/C traces 224, and polymer walls 226. As a result, blanket film 228 and polymer walls 226 form a substantially enclosed cavity around active devices 218, 220, and 222.

Continuing with step 106 in FIG. 1 and structure 206 in FIG. 2D, at step 106 of flowchart 100, removing a portion of blanket film 228 forms blanket film segment 230 and exposes I/C traces 224, where blanket film segment 230 and polymer walls 226 form a substantially enclosed cavity to house active devices 218, 220, and 220. In one embodiment, selectively removing a portion of blanket film 228 can be achieved by using a photolithography process, such as patterning and chemically etching blanket film 228, as known in the art, to form blanket film segment 230. In another embodiment, blanket film segment 230 can be formed by laser etching or other appropriate methods. In one embodiment, I/C traces 224 are not exposed by removing a portion of blanket film 228, but instead I/C traces 224 are formed on the semiconductor wafer at a later step. Thus, selectively removing portions of blanket film 228 ensures that any interconnect (i.e., I/C traces 224), such as underbump metallurgy for a solder ball pad, or a pad opening for wire bonding or tap bonding, is not covered by the blanket film. Furthermore, active devices 218, 220, and 222 are substantially enclosed by blanket film segment 230 and polymer walls 226 at once, so this batch process is much cheaper and has a faster cycle time than a traditional serial process in which a lid is individually picked and placed over each active device.

Steps 108 and 110 in FIG. 1 and structures 208 and 210 in FIGS. 2E and 2F, respectively, illustrate an exemplary interconnection and singulation technique according to one embodiment of the present invention. Steps 108 and 110 can be applied to structure 206 in FIG. 2D as one exemplary method for interconnection and singulation. Referring to step 108 in FIG. 1 and structure 208 in FIG. 2E, at step 108 of flowchart 100, I/C traces 224 are cleaned to remove any residue, such as remnants of blanket film 228, and solder bumps 232 are applied to I/C traces 224, as known in the art. Structure 208 in FIG. 2E represents the structure after solder bumping and prior to singulation. Continuing with step 110 in FIG. 1 and structure 210 in FIG. 2F, at step 110 of flowchart 100, substrate 201 in the semiconductor wafer is diced into individual dies, such as die 234, during singulation. In one embodiment, singulation can be achieved by sawing substrate 201 in the semiconductor wafer with a diamond bladed saw, for example. In other embodiments, other appropriate singulation techniques such as laser dicing can be used.

Figure 2G:
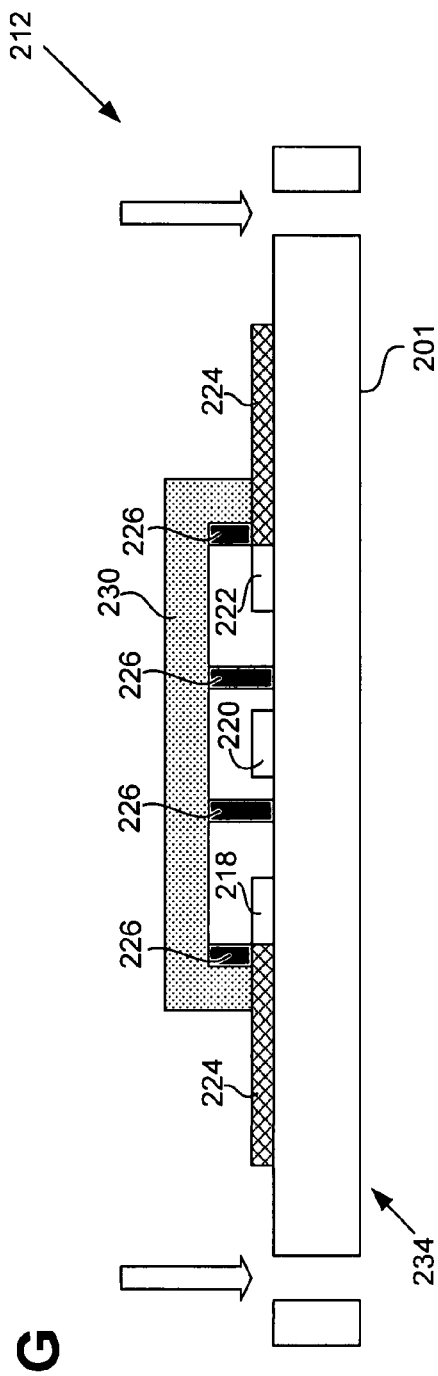
FIGS. 2G through 2H illustrate cross-sectional views, which include portions of a semiconductor wafer processed according to an embodiment of the invention, corresponding to certain steps of FIG. 1.
Figure 2H:
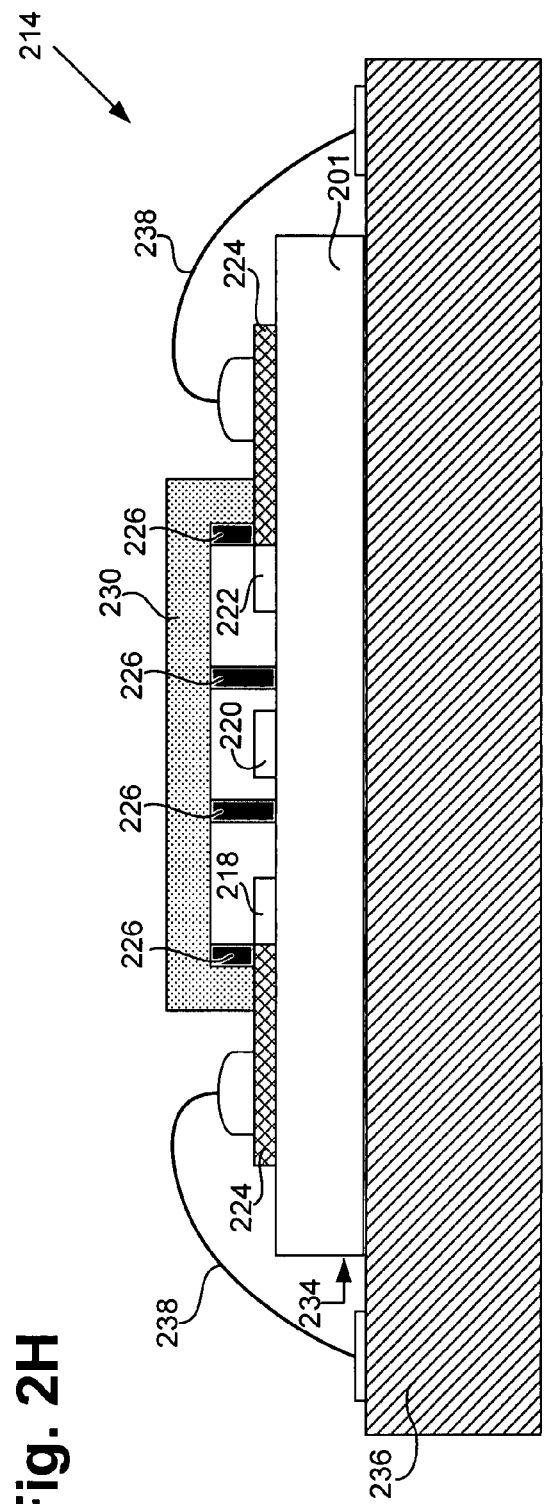

Steps 112 and 114 in FIG. 1 and structures 212 and 214 in FIGS. 2G and 2H, respectively, illustrate an exemplary interconnection and singulation technique according to another embodiment of the present invention. This corresponds to forming structures 202 through 206 as shown above in FIGS. 2B through 2D, but then skipping the steps shown in FIGS. 2E through 2F. This is illustrated on flowchart 100 in FIG. 1 by moving directly from step 106 to step 112. Referring to step 112 in FIG. 1 and structure 212 in FIG. 2G, at step 112 of flowchart 100, substrate 201 in the semiconductor wafer is diced into individual dies, such as die 234, during singulation. In the present embodiment, the semiconductor wafer is singulated into individual dies without forming solder bumps on I/C traces 224. In one embodiment, singulation can be achieved by sawing substrate 201 in the semiconductor wafer with a diamond bladed saw, for example. In other embodiments, other appropriate singulation techniques, such as laser dicing, can be used. Structure 212 in FIG. 2G represents the structure after singulation and prior to wire bonding. Continuing with step 114 in FIG. 1 and structure 214 in FIG. 2H, at step 114 of flowchart 100, die 234 is attached to circuit board 236 with bond wires 238, as shown in structure 214 in FIG. 2H.

In the manner described above, the present invention provides an improved wafer level package with cavities and method for manufacture without requiring numerous or costly process steps. In contrast to many conventional approaches that can undesirably require formation and subsequent removal of a sacrificial layer or a pick and place technique of individual lids, the present invention advantageously encloses the active devices on a semiconductor wafer in a single batch process requiring few process steps. The batch process of the present invention is cheaper and has a quicker cycle time than the conventional approaches. The present invention utilizes polymer walls 226 and blanket film segment 230 to house active devices 218, 220, and 222 in a substantially enclosed cavity. As such, the present invention provides improved manufacturing yield at a reduced cost.

From the description of the above invention it is evident that various techniques can be used for implementing the concepts of the present invention without departing from its scope and spirit. Moreover, while the invention has been described with specific reference to certain embodiments, a person of ordinary skills in the art would recognize that changes can be made in form and detail without departing from the spirit and scope of the invention.

The described embodiments are to be considered in all respects as illustrative and not restrictive. For example, in the specific embodiment of the invention described above, the substrate in the semiconductor wafer is described as having three active devices (i.e., active devices 218, 220, and 222) and having polymer walls 226 arranged around the active devices and between the active devices for additional structural support. However, it is possible to use any number of active devices, and even passive devices, on the semiconductor wafer as well as any arrangement of polymer walls depending on the application and level of structural support required. Therefore, it should be understood that the invention is not limited to the particular embodiments described herein, but is capable of many rearrangements, modifications, and substitutions without departing from the scope of the invention.

Thus, a wafer level package with cavities for active devices has been described.

The invention claimed is:

1. A method for forming a wafer level package, said method comprising:
    fabricating an active device on a substrate in a semiconductor wafer;
    forming a plurality of polymer walls defining a perimeter around said active device on said substrate;
    applying a blanket film over said semiconductor wafer and said plurality of polymer walls, said blanket film extending beyond said perimeter so as to substantially completely cover said semiconductor wafer and said active device to house said active device in a substantially enclosed cavity formed by said plurality of polymer walls and said blanket film; and
    etching said blanket film to remove a portion of said blanket film to expose interconnect traces of said active device.

2. The method of claim 1, further comprising applying solder bumps to said interconnect traces.

3. The method of claim 2, further comprising dicing said semiconductor wafer to form an individual die, said individual die comprising said active device.

4. The method of claim 1, further comprising:
    dicing said semiconductor wafer to form an individual die, said individual die comprising said device;
    wire bonding said individual die to a circuit board.

5. The method of claim 1 wherein said plurality of polymer walls comprise SU8.

6. The method of claim 1 wherein said blanket film comprises SU8.

7. The method of claim 1 wherein said blanket film comprises a dry film photoresist.

8. The method of claim 1 wherein said substantially enclosed cavity withstands a molding pressure of approximately 800 psi.

9. A method of forming a wafer level package, the method comprising:
    fabricating a plurality of active devices and interconnect traces on a substrate in a semiconductor wafer;
    forming a plurality of polymer walls on the substrate, the plurality of polymer walls defining a perimeter around the plurality of active devices;
    applying a blanket film over the substrate and extending beyond the perimeter to form a substantially enclosed cavity around the plurality of active devices; and
    etching the blanket film to remove a portion of the blanket film to expose the interconnect traces.

10. The method of claim 9, wherein forming the plurality of polymer walls includes forming the plurality of polymer walls around and in between the plurality of active devices; and
    wherein applying the blanket film includes applying the blanket film over the plurality of polymer walls to form a plurality of substantially enclosed cavities, each cavity containing at least one of the plurality of active devices.

11. The method of claim 10, further comprising dicing said semiconductor wafer to form a plurality of individual dies, each individual die comprising at least one of said plurality of active devices.

12. The method of claim 10, further comprising:
    dicing said semiconductor wafer to form a plurality of individual dies, each individual die comprising at least one of said plurality of active devices;
    wire bonding at least one of said plurality of individual dies to a circuit board.

13. The method of claim 9, wherein applying the blanket film comprises:
    spinning SU8 onto the substrate; and
    curing the SU8 to form a substantially uniform blanket film over the substrate.

14. The method of claim 9, wherein applying the blanket film comprises:
    applying a photoresist film over the substrate; and
    applying heat and pressure to the photoresist film to bond the photoresist film to a surface of the substrate and to the plurality of polymer walls.

15. The method of claim 9, wherein forming the plurality of polymer walls includes forming a plurality of SU8 walls.

16. The method of claim 9, wherein etching the blanket film includes one of chemically etching the blanket film and laser etching the blanket film.

* * * * *